United States Patent
Yamakawa

(10) Patent No.: US 9,360,723 B2
(45) Date of Patent: Jun. 7, 2016

(54) DRIVE CIRCUIT FOR LIQUID CRYSTAL DISPLAY DEVICE, AND LIQUID CRYSTAL DISPLAY DEVICE

(71) Applicant: Sharp Kabushiki Kaisha, Osaka-shi, Osaka (JP)

(72) Inventor: Ryo Yamakawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 73 days.

(21) Appl. No.: 14/345,472

(22) PCT Filed: Sep. 24, 2012

(86) PCT No.: PCT/JP2012/006053
§ 371 (c)(1),
(2) Date: Mar. 18, 2014

(87) PCT Pub. No.: WO2013/046626
PCT Pub. Date: Apr. 4, 2013

(65) Prior Publication Data
US 2014/0354908 A1  Dec. 4, 2014

(30) Foreign Application Priority Data

Sep. 30, 2011  (JP) .................................. 2011-217982

(51) Int. Cl.
*G02F 1/1362* (2006.01)
*H01G 9/28* (2006.01)
*H05K 1/16* (2006.01)
*G09G 3/36* (2006.01)

(52) U.S. Cl.
CPC ........ *G02F 1/136213* (2013.01); *G09G 3/3614* (2013.01); *G09G 3/3655* (2013.01); *H01G 9/28* (2013.01); *H05K 1/167* (2013.01); *G09G 2300/0876* (2013.01); *G09G 2320/0233* (2013.01)

(58) Field of Classification Search
CPC .............. G09G 3/20; G09G 3/36; H01G 9/28
See application file for complete search history.

(56) References Cited

U.S. PATENT DOCUMENTS

| | | | |
|---|---|---|---|
| 2001/0013851 A1 | 8/2001 | Hashimoto et al. | |
| 2001/0020670 A1* | 9/2001 | Hyoga | 250/205 |
| 2006/0022928 A1* | 2/2006 | Kim et al. | 345/94 |
| 2009/0058776 A1* | 3/2009 | Tomohiro et al. | 345/87 |
| 2010/0309394 A1* | 12/2010 | Numao et al. | 348/792 |
| 2011/0181586 A1* | 7/2011 | Morita et al. | 345/214 |
| 2013/0069925 A1* | 3/2013 | Lin et al. | 345/211 |

FOREIGN PATENT DOCUMENTS

| | | |
|---|---|---|
| JP | 11-085113 A | 3/1999 |
| JP | 2009-063938 A | 3/2009 |

OTHER PUBLICATIONS

Official Communication issued in International Patent Application No. PCT/JP2012/006053, mailed on Nov. 27, 2012.

\* cited by examiner

*Primary Examiner* — Kumar Patel
*Assistant Examiner* — Afroza Chowdhury
(74) *Attorney, Agent, or Firm* — Keating & Bennett, LLP

(57) ABSTRACT

To reduce luminance unevenness by causing an effective voltage with positive polarity and an effective voltage with negative polarity of auxiliary capacitor lines to be equal to each other, an auxiliary capacitor line voltage-applying circuit 104 of a drive circuit for a liquid crystal display device includes a voltage generator circuit 121 configured to output voltages to be applied to a liquid crystal panel, where the voltages are with polarity being alternately reversed, and current adjustment circuits 121 each configured to adjust at least one of a current flowing out from the output circuit or a current flowing into the output circuit.

10 Claims, 4 Drawing Sheets

POTENTIAL OF AUXILIARY CAPACITOR LINE 105

POTENTIAL OF AUXILIARY CAPACITOR LINE 106

DRIVE CIRCUIT FOR LIQUID CRYSTAL DISPLAY DEVICE, AND LIQUID CRYSTAL DISPLAY DEVICE

TECHNICAL FIELD

The present disclosure relates to liquid crystal display devices, in particular, to a liquid crystal display device employing, e.g., the so-called pixel division method and configured to control voltages of auxiliary capacitor lines as well as to a drive circuit for the liquid crystal display device.

BACKGROUND ART

A method of dividing a pixel into a plurality of sub-pixels and applying different voltages to the liquid crystal layers of the sub-pixels is known as a technique to improve viewing angle dependence of γ characteristic of a liquid crystal display device. According to this method, since the sub-pixels with different γ characteristics composited according to corresponding viewing angles are viewed, the viewing angle dependence of γ characteristic is improved.

A technique to connect auxiliary capacitors to liquid crystal capacitors formed between pixel electrodes and a counter electrode is known as a method of applying different voltages to the liquid crystal layers of multiple sub-pixels as described above. Specifically, according to this technique, after applying an identical source line voltage to the pixel electrodes of the sub-pixels, voltages of auxiliary capacitor lines each connected to an end of a corresponding one of the auxiliary capacitors are independently changed. Consequently, since the voltage of each pixel electrode independently changes, it is possible to apply different voltages to the liquid crystal layers (see, e.g., Patent Document 1).

The voltages of the auxiliary capacitor lines are usually changed more than once after application of the source line voltage to the pixel electrodes. For example, the voltages of the auxiliary capacitor lines are repeatedly changed in a positive-going direction or a negative-going direction with respect to the voltage of the counter electrode, in every one horizontal period or in every period which is an integral multiple of the horizontal period, for example.

CITATION LIST

Patent Document

PATENT DOCUMENT 1: Japanese Unexamined Patent Publication No. 2009-63938

SUMMARY OF THE INVENTION

Technical Problem

In the configuration in which the voltages of the auxiliary capacitor lines repeatedly change as described above, if an effective voltage existing when the voltages of the auxiliary capacitor lines each have changed in the positive-going direction with respect to the voltage of the counter electrode is unequal to an effective voltage existing when the voltages of the auxiliary capacitor lines each have changed in the negative-going direction with respect to the voltage of the counter electrode, for example, the voltages applied to the liquid crystal become nonuniform, thereby causing unevenness in luminance such as streaks along scanning lines. The difference between the positive and negative effective voltages is caused by, e.g., a difference between a period during which the positive voltage is applied and a period during which the negative voltage is applied. On the other hand, since the difference between the periods is caused by, e.g., a difference between rising edge characteristics and falling edge characteristics of the elements forming the circuit, it is difficult to control the circuit such that the periods becomes exactly equal to each other.

Thus, with the conventional liquid crystal display device as described above, it is difficult to cause the effective voltages of the auxiliary capacitor lines to be equal in respect of the positive-going and negative-going directions with respect to the voltage of the counter electrode. Consequently, the conventional device has a disadvantage that reduction of luminance unevenness by making uniform the voltages applied to the liquid crystal is difficult.

It is therefore an object of the present disclosure to reduce luminance unevenness by causing an effective voltage with positive polarity and an effective voltage with negative polarity of the auxiliary capacitor lines to be equal to each other.

Solution to the Problem

A first aspect of the present disclosure relates to a drive circuit for a liquid crystal display device, including: an output circuit configured to output voltages to be applied to a liquid crystal panel, where the voltages are with polarity being alternately reversed; and adjustment circuits each configured to adjust at least one of a current flowing out from the output circuit or a current flowing into the output circuit.

A second aspect of the present disclosure relates to the drive circuit of the first aspect, wherein the liquid crystal panel includes auxiliary capacitors each connected to an associated one of liquid crystal capacitors and auxiliary capacitor lines through which the voltages are applied to the auxiliary capacitors, and the output circuit is configured to apply the output voltages to the auxiliary capacitor lines.

A third aspect of the present disclosure relates to the drive circuit of the second aspect, wherein, in the liquid crystal panel, each of pixels is divided into sub-pixels each of which includes an associated one of the liquid crystal capacitors and an associated one of the auxiliary capacitors, the output circuit is configured to apply the voltages to the auxiliary capacitor lines corresponding to the sub-pixels, and the voltages applied by the output circuit are opposite to each other in polarity.

With these aspects, it is possible to independently adjust the current flowing out from the output circuit and/or the current flowing into the output circuit. Accordingly, unevenness in luminance can be reduced by, e.g., making equal an effective voltage with positive polarity and an effective voltage with negative polarity of the auxiliary capacitor lines which are connected to the auxiliary capacitors connected to the liquid crystal capacitors.

A fourth aspect of the present disclosure relate to the drive circuit of the second or third aspect, wherein each of the adjustment circuits is shared by a plurality of associated ones of the auxiliary capacitor lines.

With this configuration, the number of the adjustment circuits can be reduced, and accordingly, the size of the drive circuit can be reduced.

A fifth aspect of the present disclosure relates to the drive circuit of the second or third aspect, wherein each of the adjustment circuits corresponds to an associated one of the auxiliary capacitor lines.

With this configuration, it is possible to implement adjustment in accordance with variation in the characteristics of the auxiliary capacitor lines of each display line, for example.

A sixth aspect of the present disclosure relates to the drive circuit of any one of the first to fifth aspects, wherein each of the adjustment circuits includes a series combination of two sets of a variable resistor and a rectifier which are connected in parallel with each other, or a parallel combination of two sets of the variable resistor and the rectifier which are connected in series to each other.

According to this aspect, it is possible, with a relatively simple circuit configuration, to implement adjustment by which the effective voltages with positive or negative polarity of the auxiliary capacitor lines are made to be equal.

A seventh aspect of the present disclosure relates to a liquid crystal display device including: the liquid crystal panel of any one of the first to sixth aspects; and the drive circuit of any one of the first to sixth aspects.

With this configuration, in a manner similar to the above, luminance unevenness can be reduced by making equal the effective voltages with positive or negative polarity of the auxiliary capacitor lines connected to the auxiliary capacitors, and accordingly, liquid crystal display device can be improved in display quality.

Advantages of the Invention

According to the present disclosure, luminance unevenness can be easily reduced by causing an effective voltage with positive polarity and an effective voltage with negative polarity of auxiliary capacitor lines to be equal to each other.

DESCRIPTION OF EMBODIMENTS

Figure 1:
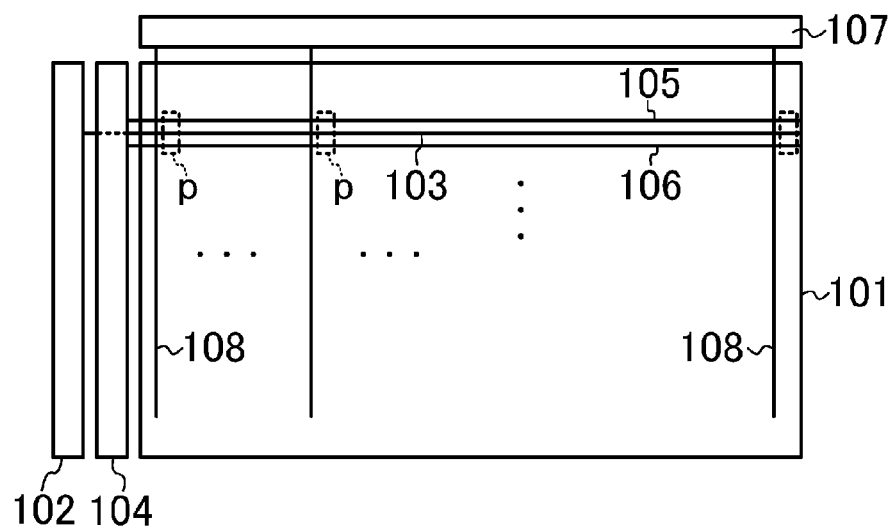
FIG. 1 is a block diagram schematically illustrating a configuration of a liquid crystal display device according to a first embodiment.

Embodiments of the present disclosure will be described below in detail with reference to the drawings. In the embodiments, components having a similar function are denoted by the same reference character and detailed description of the components is not repeated.

First Embodiment (Configuration of Liquid Crystal Display Device)

As illustrated in FIG. 1, a liquid crystal display device made by enclosing a liquid crystal between a pair of glass substrates includes a liquid crystal panel 101, a gate driver 102, gate lines 103, an auxiliary capacitor line voltage-applying circuit 104, auxiliary capacitor lines 105 and 106, a source driver 107, and source lines 108. The gate driver 102 is configured to select a display line by activating one of the gate lines 103 in a selective manner. The source driver 107 is configured to generate voltages in accordance with image data signals and to apply, through the source lines 108, the voltages to the pixels of the display line selected by the gate driver 102.

Figure 2:
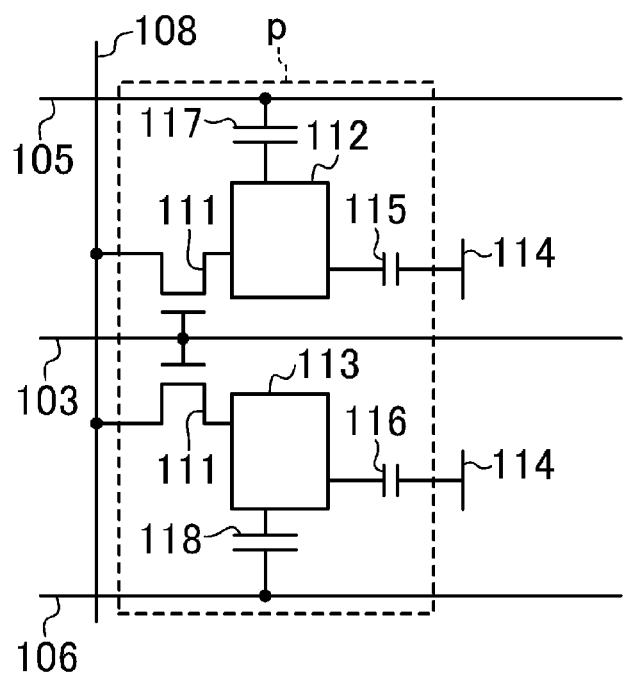
FIG. 2 is a circuit diagram illustrating a main portion of a liquid crystal panel 101 of the first embodiment.

Display pixels p are arranged such that each display pixel p corresponds to an associated one of intersections of the gate lines 103, the auxiliary capacitor lines 105 and 106, and the source lines 108. As illustrated in FIG. 2, each display pixel p includes two switching elements 111 (i.e., thin-film transistors; TFTs). The source electrode and the gate electrode of each of the switching elements 111 are in connection to the source line 108 and the gate line 103, respectively.

The drain electrodes of the switching elements 111 are in connection to sub-pixel electrodes 112 and 113. Liquid crystal capacitors 115 and 116 are provided between the sub-pixel electrodes 112 and 113 and a counter electrode 114 which is a common electrode provided opposite to the sub-pixel electrodes 112 and 113. A voltage corresponding to charge accumulated in each of the liquid crystal capacitors 115 and 116 is applied to the liquid crystal, and consequently, display with a luminance corresponding to the applied voltage is provided. Further, an auxiliary capacitor 117 is disposed between the sub-pixel electrode 112 and the auxiliary capacitor line 105, and an auxiliary capacitor 118 is disposed between the sub-pixel electrode 113 and the auxiliary capacitor line 106. The auxiliary capacitors 117 and 118 assist the liquid crystal capacitors 115 and 116 in accumulating charge, respectively.

Figure 3:
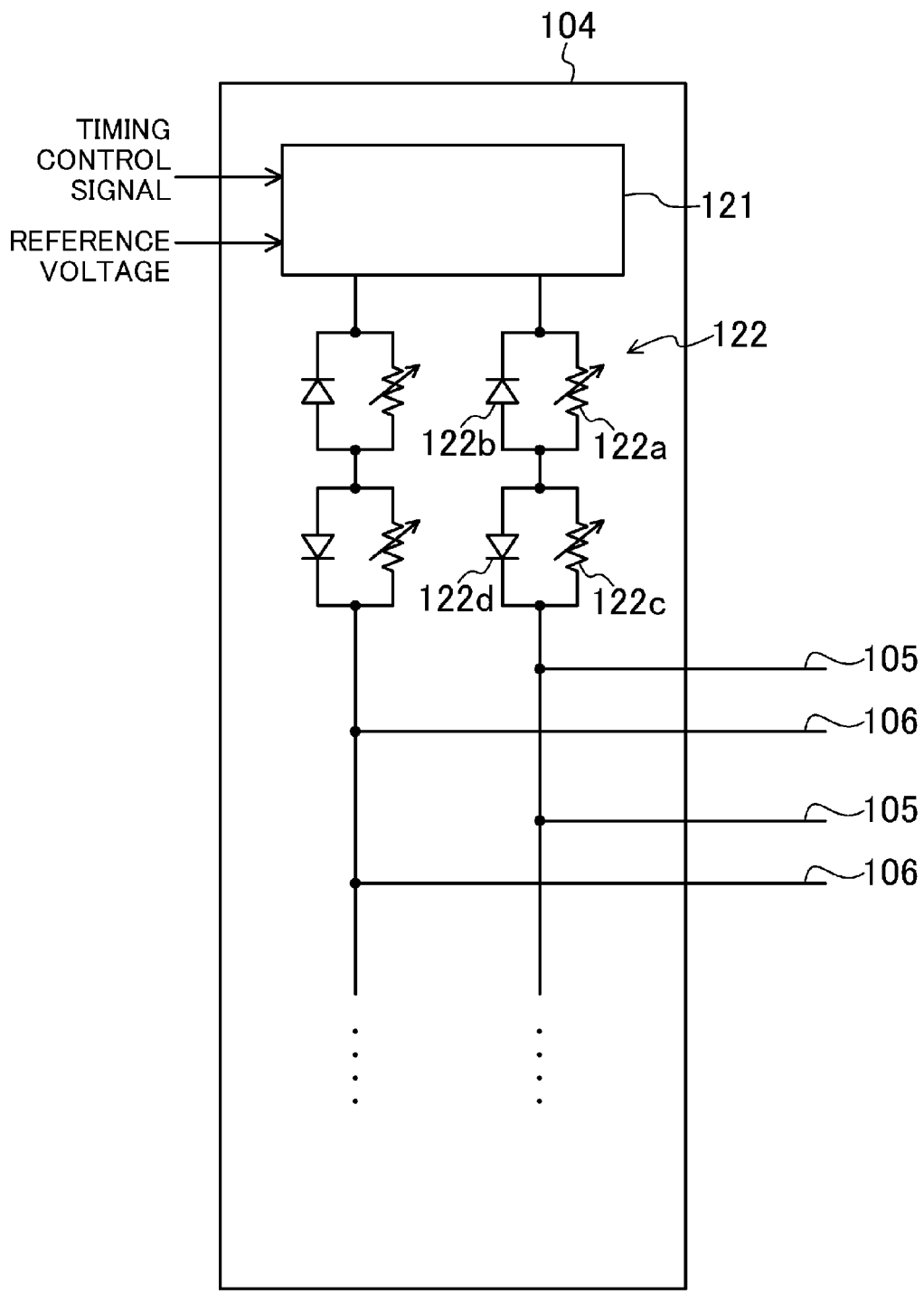
FIG. 3 is a circuit diagram illustrating a main portion of an auxiliary capacitor line voltage-applying circuit 104 of the first embodiment.

Specifically, as illustrated in FIG. 3 for example, the auxiliary capacitor line voltage-applying circuit 104 includes a voltage generator circuit 121 (an output circuit) which generates, on the basis of a timing control signal and a reference voltage, auxiliary capacitor line voltages to be applied to the auxiliary capacitor lines 105 and 106, and current adjustment circuits 122 (adjustment circuits) which adjust the amounts of currents flowing to the auxiliary capacitor lines 105 and 106. Each of the current adjustment circuits 122 corresponds to the auxiliary capacitor lines 105 or the auxiliary capacitor lines 106, and includes a set of variable resistors 122a and 122c and diodes 122b and 122d (rectifier elements). More specifically, in each current adjustment circuit 122, a parallel combination of the variable resistor 122a and the diode 122b is connected in series to a parallel combination of the variable resistor 122c and the diode 122d. Here, the diodes 122b and 122d are connected in such a manner that the forward direction of the diode 122b is opposite to the forward direction of the diode 122d. The current adjustment circuits 122 may be provided at the liquid crystal panel 101, for example.

(Operation by Liquid Crystal Display Device)

The liquid crystal display device having the above configuration provides display in the following manner.

First, the voltage of a selected one of the gate lines 103 changes from Low level (L-level) to High level (H-level), and consequently, the switching elements 111 included in each corresponding display pixel and connected to the selected gate line 103 are both turned on. The voltage of the corresponding source line 108 is then applied to the sub-pixel electrodes 112 and 113, and consequently, the liquid crystal capacitors 115 and 116 and the auxiliary capacitors 117 and 118 are charged.

Next, the voltage of the selected gate line 103 changes from H-level to L-level, and consequently, the switching elements 111 are both turned off. Accordingly, all of the liquid crystal capacitors 115 and 116 and the auxiliary capacitors 117 and 118 are electrically insulated from the corresponding source line 108.

Figure 4:
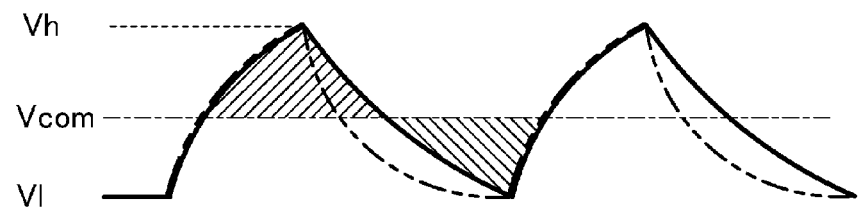
FIG. 4 is a graph showing changes in voltage of auxiliary capacitor lines 105 and 106 of the first embodiment.
Figure 4:
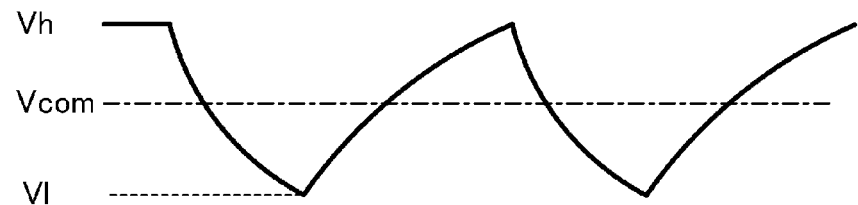

Thereafter, as illustrated in FIG. 4 for example, the voltages of the auxiliary capacitor lines 105 and 106 that are respectively connected to the auxiliary capacitors 117 and 118 each change between Vl and Vh in every one horizontal period for example. The transfer of charge accompanying these voltage changes causes the voltages of the sub-pixel electrodes 112 and 113 to change opposite to each other in the positive-going or negative going direction. In this manner, different voltages are applied to the liquid crystal capacitors 115 and 116, and the sub-pixels with different γ characteristics composited according to corresponding viewing angles are viewed, resulting in improvement of the viewing angle dependence of γ characteristic.

In general, a duty ratio of a voltage output by the voltage generator circuit 121 of the auxiliary capacitor line voltage-applying circuit 104 is not always 1:1 because of the difference between rising edge characteristics and falling edge characteristics of the elements forming the auxiliary capacitor line voltage-applying circuit 104. Accordingly, a period during which the voltage of the auxiliary capacitor line 105 or 106 is higher than a voltage Vcom of the counter electrode 114 is not always equal to a period during which the voltage of the auxiliary capacitor line 105 or 106 is lower than the voltage Vcom of the counter electrode 114. Therefore, when the voltage of the auxiliary capacitor line 105 changes as indicated by the dot-dot-dash line in FIG. 4 for example, an effective voltage which is positive-going with respect to the voltage Vcom of the counter electrode 114 and an effective voltage which is negative-going with respect to the voltage Vcom (i.e., the areas of the hatched regions or mean voltages) are different from each other, resulting in luminance unevenness in a displayed image.

When the luminance unevenness is caused, according to this embodiment, an increasing gradient and a decrease gradient of the voltage of the auxiliary capacitor line 105 are made asymmetrical as indicated by the solid line in FIG. 4 by adjusting the variable resistors 122a and 122c of the corresponding current adjustment circuit 122. In this manner, the effective voltage that is positive-going with respect to the voltage Vcom and the effective voltage that is negative-going with respect to the voltage Vcom are made to be equal to each other, and consequently, the luminance unevenness can be eliminated or reduced.

Specifically, the adjustment of the variable resistors is as follows. To increase or reduce the currents flowing from the voltage generator circuit 121 to the auxiliary capacitor lines 105 and 106, the resistance of the variable resistors 122a is reduced or increased. To increase or reduce the currents flowing from the auxiliary capacitor lines 105 and 106 to the voltage generator circuit 121, the resistance of the variable resistors 122c is reduced or increased. Thus, since output characteristics can be independently adjusted according to the polarity of output of the voltage generator circuit 121, it is possible to easily cause the effective voltage with positive polarity and the effective voltage with negative polarity to become equal to each other even when a period during which the voltage of the auxiliary capacitor line is positive relative to the voltage Vcom and a period during which the voltage of the auxiliary capacitor line is negative relative to the voltage Vcom are uneven. For example, the adjustment of the variable resistors is implemented while practically observing a displayed image in fabrication of the liquid crystal display device. In this manner, the luminance unevenness caused by variation in the characteristics of the auxiliary capacitor line voltage-applying circuit 104 and the liquid crystal panel 101 can be minimized.

Second Embodiment

Figure 5:
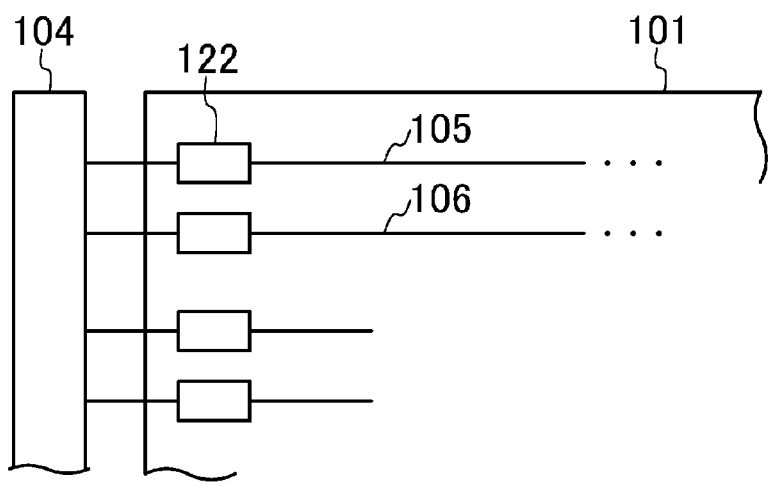
FIG. 5 is a block diagram illustrating a main portion of a liquid crystal display device according to a second embodiment.

The current adjustment circuits 122 may not be arranged such that each of the current adjustment circuits 122 corresponds to all of the auxiliary capacitor lines 105 or all of the auxiliary capacitor lines 106. For example, as illustrated in FIG. 5, each of the current adjustment circuits 122 may correspond to an associated one of the auxiliary capacitor lines 105 or an associated one of the auxiliary capacitor lines 106. With this configuration, it is possible to implement the adjustment in accordance with variation in the characteristics of the lines and the switching elements 111 associated with each display line, for example. The current adjustment circuits 122 may be arranged not only on a one-by-one basis for each of the auxiliary capacitor lines 105 and 106, but also on a one-by-one basis for a group of several adjacent ones of the auxiliary capacitor lines 105 or a group of several adjacent ones of the auxiliary capacitor lines 106.

Third Embodiment

Figure 6:
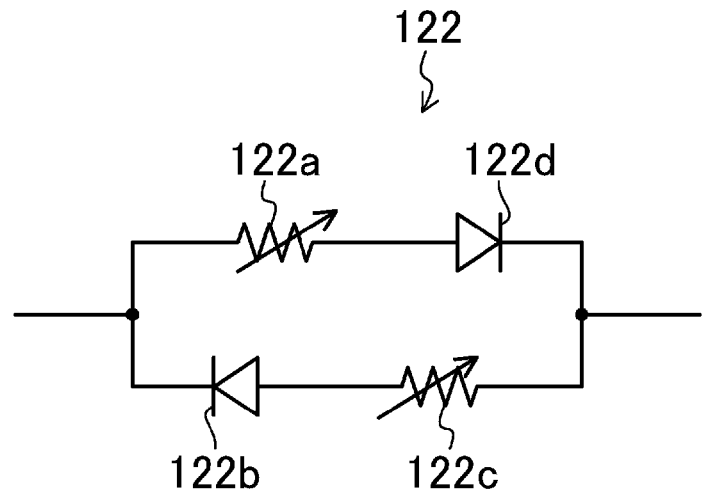
FIG. 6 is a circuit diagram illustrating a configuration of a current adjustment circuit 122 of a third embodiment.

The current adjustment circuits 122 are not limited to the configuration illustrated in FIG. 3, and may have a configuration as illustrated in FIG. 6. Specifically, each of the current adjustment circuits 122 may include a series combination of the variable resistor 122a and the diode 122b which is connected in parallel to a series combination of the variable resistor 122c and the diode 122d. With this configuration, it is also possible to independently adjust the output currents in accordance with the polarity of output of the voltage generator circuit 121, in a manner similar to that described in the first embodiment.

Figure 7:
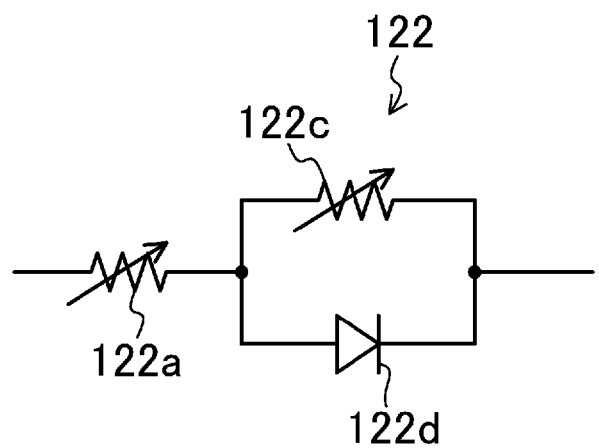
FIG. 7 is a circuit diagram illustrating a configuration of a current adjustment circuit 122 of a variation of the third embodiment.

Further, as illustrated in FIG. 7, the diode 122b may be omitted from each of the current adjustment circuits 122 illustrated in FIG. 3. With this configuration, it is also possible to adjust the output currents in accordance with the polarity if a current with positive or negative polarity is always greater than the other current with the opposite polarity. In a similar manner, the diode 122b may also be omitted from the current adjustment circuit 122 illustrated in FIG. 6. Furthermore, the variable resistor 122a may also be omitted such that only a current with positive polarity or a current with negative polarity can be controlled.

Additional Possible Variations

The first embodiment exemplifies the case in which the current adjustment circuits 122 are adjusted while practically observing a displayed image. However, the present disclosure is not limited to the exemplified case, and the current adjustment circuits 122 may be adjusted such that effective values become equal to each other, for example. In such a case, it is also possible to implement the adjustment in accordance with only the characteristics of the auxiliary capacitor line voltage-applying circuit 104 before combining the circuit 104 with the liquid crystal panel 101.

In addition, the adjustment may be implemented not only in fabrication of the liquid crystal display device, but also in response to time-varying changes occurring when the liquid crystal display device is used.

Each of the variable resistors 122a and 122c is not limited to a particular type. For example, the resistance may be adjusted in a fixed manner by trimming a resistor material. Alternatively, the resistance may be adjusted by means of electrical or mechanical control.

The above embodiments exemplify the liquid crystal display device employing the pixel division method, in which the voltages of the auxiliary capacitor lines are adjusted. However, the present disclosure is also applicable to, e.g., liquid crystal display devices which employ the so-called inversion drive method and are configured such that a voltage and/or a current is supplied to reverse the polarity of a source driver.

INDUSTRIAL APPLICABILITY

As described above, the present disclosure is useful for, e.g., liquid crystal display devices which employ the so-called pixel division method and are configured to control the voltages of auxiliary capacitor lines.

DESCRIPTION OF REFERENCE CHARACTERS

101 Liquid crystal panel
102 Gate driver
103 Gate line
104 Auxiliary capacitor line voltage-applying circuit
105, 106 Auxiliary capacitor line
107 Source driver
108 Source line
111 Switching element
112, 113 Sub-pixel electrode
114 Counter electrode
115, 116 Liquid crystal capacitor
117, 118 Auxiliary capacitor
121 Voltage generator circuit
122 Current adjustment circuit
122a, 122c Variable resistor
122b, 122d Diode

The invention claimed is:

1. A drive circuit for a liquid crystal display device, the drive circuit comprising:
    an output circuit configured to output voltages to be applied to a liquid crystal panel, the voltages with polarity being alternately reversed; and
    adjustment circuits each configured to adjust at least one of a current flowing out from the output circuit or a current flowing into the output circuit; wherein
    each of the adjustment circuits includes two sets of a variable resistor and a rectifier;
    the variable resistor and the rectifier of each of the two sets are connected in parallel with each other, and the two sets of the variable resistor and the rectifier are connected to each other in series; and
    the rectifier of each of the two sets is connected such that a forward direction of the rectifier of one of the two sets is opposite to a forward direction of the rectifier of the other of the two sets.

2. The drive circuit of claim 1, wherein
    in the liquid crystal panel, each of pixels is divided into sub-pixels each of which includes an associated one of the liquid crystal capacitors and an associated one of the auxiliary capacitors,
    the output circuit is configured to apply the voltages to the auxiliary capacitor lines corresponding to the sub-pixels, and
    the voltages applied by the output circuit are opposite to each other in polarity.

3. The drive circuit of claim 1, wherein
    each of the adjustment circuits is shared by a plurality of associated ones of the auxiliary capacitor lines.

4. The drive circuit of claim 1, wherein
    each of the adjustment circuits corresponds to an associated one of the auxiliary capacitor lines.

5. A liquid crystal display device comprising:
    the liquid crystal panel of claim 1; and
    the drive circuit of claim 1.

6. A drive circuit for a liquid crystal display device, the drive circuit comprising:
    an output circuit configured to output voltages to be applied to a liquid crystal panel, the voltages with polarity being alternately reversed; and
    adjustment circuits each configured to adjust at least one of a current flowing out from the output circuit or a current flowing into the output circuit; wherein
    each of the adjustment circuits includes two sets of a variable resistor and a rectifier;
    the variable resistor and the rectifier of each of the two sets are connected in series with each other; and
    the rectifier of each of the two sets is connected in such a manner that a forward direction of the rectifier of one of the two sets is opposite to a forward direction of the rectifier of the other of the two sets.

7. The drive circuit of claim 6, wherein the two sets of the variable resistor and the rectifier are connected to each other in parallel.

8. The drive circuit of claim 6, wherein
    in the liquid crystal panel, each of pixels is divided into sub-pixels each of which includes an associated one of the liquid crystal capacitors and an associated one of the auxiliary capacitors,
    the output circuit is configured to apply the voltages to the auxiliary capacitor lines corresponding to the sub-pixels, and
    the voltages applied by the output circuit are opposite to each other in polarity.

9. The drive circuit of claim 6, wherein
    each of the adjustment circuits is shared by a plurality of associated ones of the auxiliary capacitor lines.

10. The drive circuit of claim 6, wherein
    each of the adjustment circuits corresponds to an associated one of the auxiliary capacitor lines.

* * * * *